United States Patent
Komai (10) Patent No.: US 9,343,186 B2
(45) Date of Patent: May 17, 2016

(54) SEMICONDUCTOR STORAGE DEVICE (71) Applicant: Kabushiki Kaisha Toshiba, Minato-ku (JP)

(72) Inventor: Hiromitsu Komai, Kamakura (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 62 days.

(21) Appl. No.: 14/482,697

(22) Filed: Sep. 10, 2014

(65) Prior Publication Data

US 2015/0254010 A1 Sep. 10, 2015

Related U.S. Application Data (60) Provisional application No. 61/949,807, filed on Mar. 7, 2014.

(51) Int. Cl.
*G06F 12/00* (2006.01)
*G06F 13/00* (2006.01)
*G11C 29/00* (2006.01)
*G06F 12/06* (2006.01)

(52) U.S. Cl.
CPC ............ *G11C 29/82* (2013.01); *G06F 12/0607* (2013.01)

(58) Field of Classification Search
USPC ......................................................... 711/103
See application file for complete search history.

(56) References Cited

U.S. PATENT DOCUMENTS

| | | | | | |
|---|---|---|---|---|---|
| 5,701,270 | A | * | 12/1997 | Mohan Rao | G11C 29/80 365/200 |
| 6,032,220 | A | * | 2/2000 | Martin | G06F 12/06 711/105 |
| 7,864,580 | B2 | * | 1/2011 | Tokiwa | G11C 16/06 365/185.09 |
| 8,040,727 | B1 | * | 10/2011 | Harari | G06F 3/0616 365/185.09 |
| 2004/0019763 | A1 | * | 1/2004 | Lakhani | G11C 29/789 711/206 |
| 2006/0028864 | A1 | * | 2/2006 | Rinerson | G11C 11/16 365/158 |
| 2007/0011406 | A1 | * | 1/2007 | Takase | G06F 12/1027 711/128 |
| 2007/0038800 | A1 | * | 2/2007 | Lakhani | G06F 12/0246 711/5 |
| 2008/0177933 | A1 | * | 7/2008 | Nobunaga | G11C 29/76 711/103 |
| 2009/0204847 | A1 | * | 8/2009 | Lakhani | G11C 29/808 714/6.13 |

* cited by examiner

*Primary Examiner* — Sean D Rossiter
(74) *Attorney, Agent, or Firm* — Oblon, McClelland, Maier & Neustadt, L.L.P (57) ABSTRACT

A semiconductor storage device has a cell array, a redundant array provided logically separated from the cell array, a cache memory having a storing area of data read from or written in the cell array by one access, defective column storage to store a column address of a defective column in the cell array, a defective column determination module to determine whether a column address to be accessed matches the column address stored in the defective column storage, and a clock generator to generate a clock for accessing each of the divided areas for each period of the interleave access and, when the defective column determination module determines that there is a match, instead of a clock accessing a divided page buffer area at the generation timing of the clock accessing the divided page buffer area.

11 Claims, 8 Drawing Sheets

1: SEMICONDUCTOR STORAGE DEVICE

SEMICONDUCTOR STORAGE DEVICE

CROSS REFERENCE TO RELATED APPLICATIONS

This application is based upon and claims the benefit of U.S. provisional Application No. 61/949,807, filed on Mar. 7, 2014, the entire contents of which are incorporated herein by reference.

FIELD

The present invention relates to a semiconductor storage device capable of replacing defective columns.

BACKGROUND

NAND flash memories and the like are provided with a page buffer (also referred to as a cache memory or a data latch) in addition to a cell array. One-page data read from and written in the cell array is stored in the page buffer.

Column decoders are connected to a page buffer. The column decoders take time for operation, so that it is required to secure a cycle time to the page buffer. For this reason, a method often adopted is an interleave method for accessing a page buffer logically divided into a plurality of areas, when data to each divided area (referred to as a divided page buffer area, hereinafter) is ready.

Access to a cell array is made for each page, and if a column address is a defective address, it is replaced with a redundant column.

In the known interleave method, if there is a defective column in one interleave period, access is made not to a divided page buffer area including the defective column but to another divided page buffer area. Therefore, there is a problem in that, for example, even if originally 5 interleave should be performed, 3 interleave is performed if there are defective columns in two divided page buffer areas, which leads to decrease in interleave efficiency, and hence high-speed data input/out to/from a page buffer cannot be achieved.

DETAILED DESCRIPTION

A semiconductor storage device according to an embodiment is provided with:

a cell array;

a redundant array provided logically separated from the cell array, the redundant array having a column area replaceable with a defective column in the cell array;

a cache memory having a storing area of data read from or written in the cell array by one access, the cache memory allowing interleave access to a plurality of divided areas to which the area is logically divided;

a defective column storage to store a column address of a defective column in the cell array;

a defective column determination module to determine whether a column address to be accessed matches the column address stored in the defective column storage; and a clock generator to generate a clock for accessing each of the divided areas for each period of the interleave access and, when the defective column determination module determines that there is a match, instead of a clock for accessing a divided page buffer area that corresponds to the defective column, at the generation timing of the clock accessing the divided page buffer area, to generate a clock accessing the redundant array that has stored data of the defective column.

Hereinafter, an embodiment of the present invention will be explained with reference to the drawings. In the following embodiment, an explanation will be made mostly for unique structures and operations in a semiconductor storage device. However, the semiconductor storage device may have structures and operations omitted in the following explanation. These omitted structures and operations are also within the scope of the present embodiment.

Figure 1:
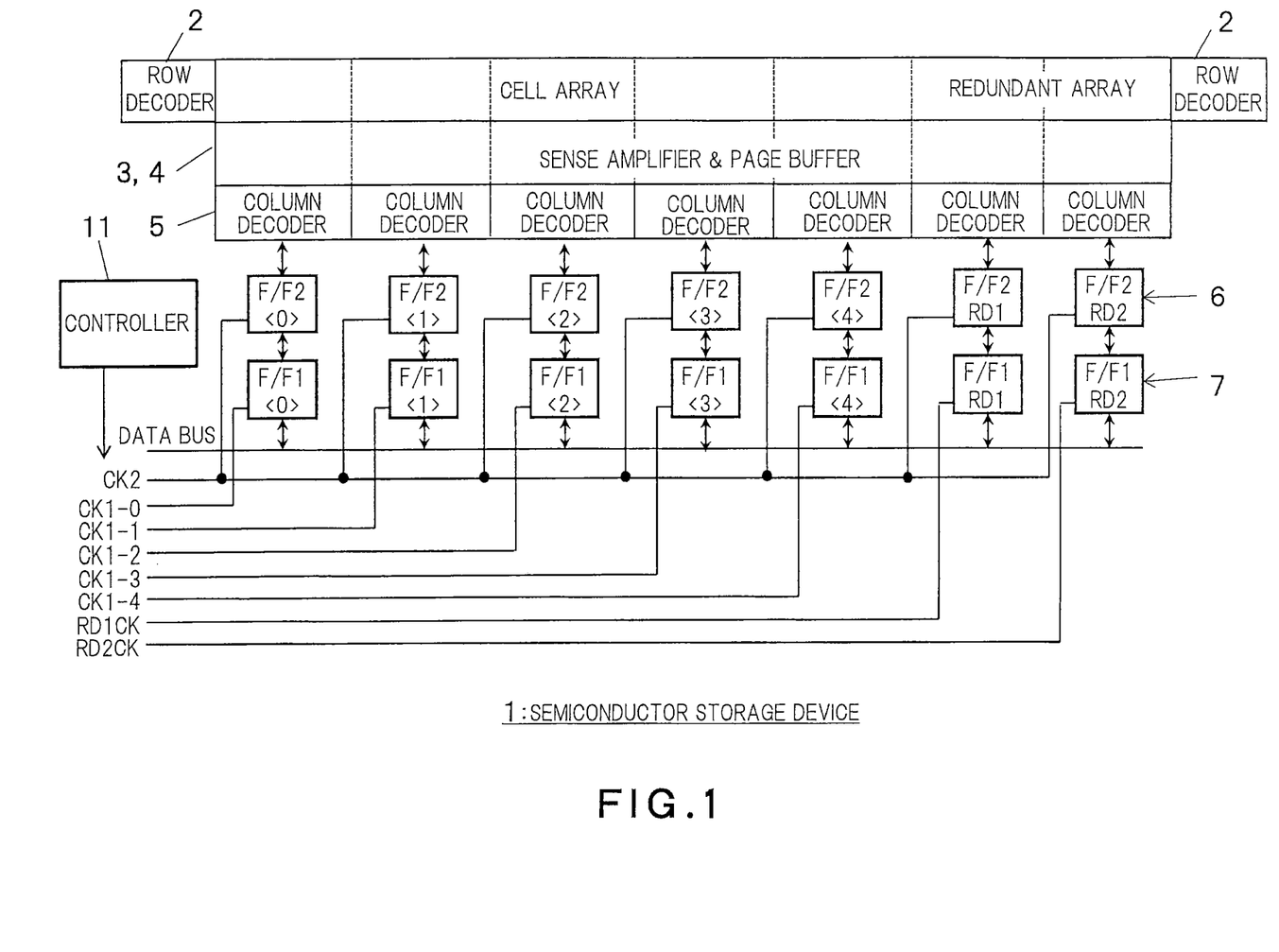
FIG. 1 is a block diagram schematically showing the structure of a semiconductor storage device 1 according to an embodiment.

FIG. 1 is a block diagram schematically showing the structure of a semiconductor storage device 1 according to an embodiment. The semiconductor storage device 1 of FIG. 1 is a NAND flash memory, as an example.

The semiconductor storage device 1 of FIG. 1 is provided with a cell array 8 and a redundant array 9 with which defect columns in the cell array 8 can be replaced.

The cell array 8 and the redundant array 9 have the same internal structure. However, the cell array 8 and the redundant array 9 may have the same or different memory capacities. The cell array 8 and the redundant array 9 have the same number of word lines, hence the memory capacity can be changed by varying the number of bit lines.

The cell array 8 and the redundant array 9 are physically formed into one memory cell array but logically divided from each other. The cell array 8 is accessible by a user program. By contrast, a user cannot access the redundant array 9 consciously. When there is a defective column in the cell array 8, it is automatically replaced with a redundant column in the redundant array 9.

The cell array 8 and the redundant array 9 are arranged in a row direction, with row decoders 2 arranged on both sides of the arranged arrays. One of the row decoders 2 is used for driving even-numbered word lines whereas the other row decoder 2 is used for driving odd-numbered word lines.

Memory cells in the cell array 8 are accessed by each page. One page is every memory cell connected to one word line in the row direction. Each memory cell connected to one word line has a plurality of columns. One column corresponds to a 1-byte memory cell.

The cell array 8 has a user column area for storing data in each column so as to be associated with a column address specified by a user program, and an ECC (Error Checking and Correcting) column area for storing error correction data in each column. However, the cell array 8 according to the present embodiment is not required to have redundant columns.

By contrast, the redundant array 9 has a redundant column area with which a defective column in the cell array 8 can be replaced. As described above, it is a precondition for the present embodiment that a defective column in the cell array 8 is replaced with a column in the redundant array 9 that is provided separately from the cell array 8, with no necessity of providing a redundant column in the cell array 8.

Figure 2:
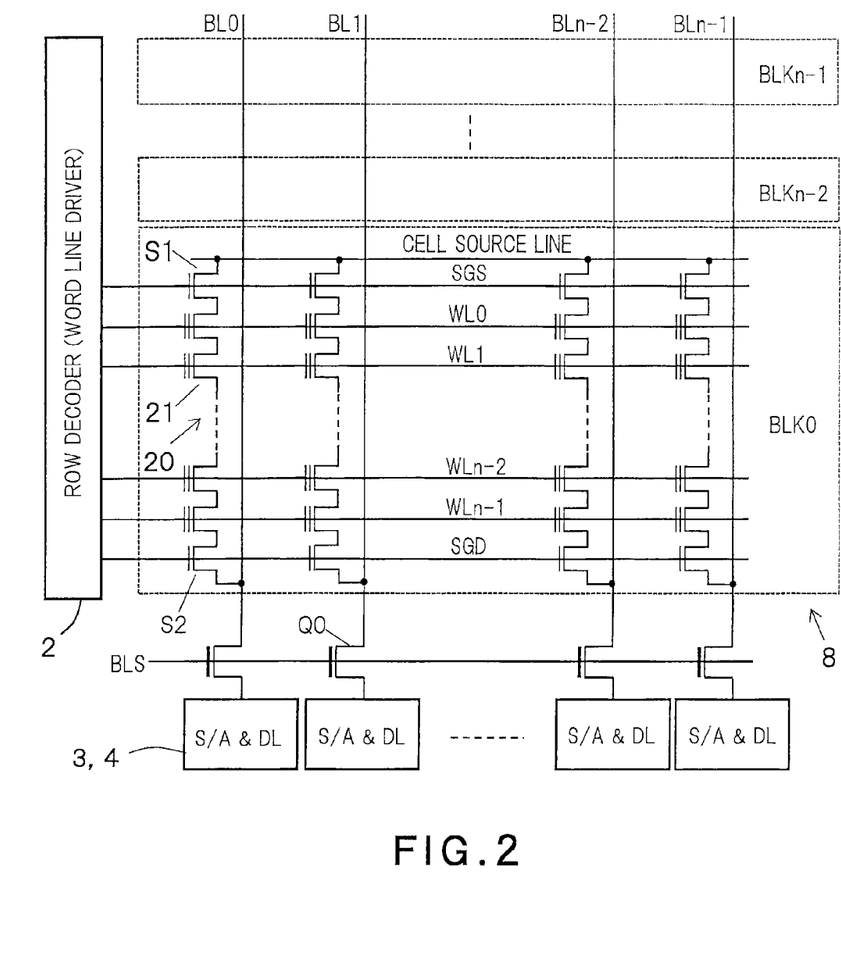
FIG. 2 shows an example of the internal structure of a cell array 8.

FIG. 2 shows an example of the internal structure of the cell array 8. As shown in FIG. 2, the cell array 8 is divided into a plurality of blocks BLK0 to BLKn-1. In each block, a plurality of NAND strings 20 are arranged in a column direction. Each NAND string 20 has a plurality of series-connected memory cells 21, a select gate transistor S1 connected to one end of the memory cells 21, and a gate transistor S2 connected to other end of the memory cells 21. The memory cells in the cell array are erased in each block.

The gates of the memory cells 21 in each NAND string 20 are connected to corresponding word lines WL0 to WLn-1, respectively. The gate of the select gate transistor S1 is connected to a select gate line SGS. The gate of the select gate transistor S2 is connected to a select gate line SGD. The NAND strings 20 are connected to a common cell source line via the corresponding select gate transistors S1. The NAND strings 20 are connected to corresponding bit lines BL0 to BLn-1, respectively, via the corresponding select gate transistors S2.

The word lines WL0 to WLn-1 connected to the gates of the corresponding memory cells 21 in each NAND string 20 are connected to a row decoder 2. The row decoder 2 decodes a row address transferred from an address register (not shown).

Each of the bit lines BL0 to BLn-1 connected to the corresponding NAND string 20 is connected to a sense amplifier (S/A) 3 via a bit line select transistor Q0. Read data detected by the sense amplifier 3 is held by a page buffer (DL) 4 paired with the sense amplifier 3, as binary data, for example. The page buffer 4 has a 1-page storage area. Data acquired from the cell array 8 at each accessing is stored in the page buffer 4. As described above, the page buffer 4 is also referred to as a cache memory, data latch, etc.

Column decoders 5 shown in FIG. 1 decode a column address from an address register (not shown). Moreover, the column decoders 5 determine whether to transfer data held by the page buffers 4 to a data bus, based on a result of decoding.

Figure 3:
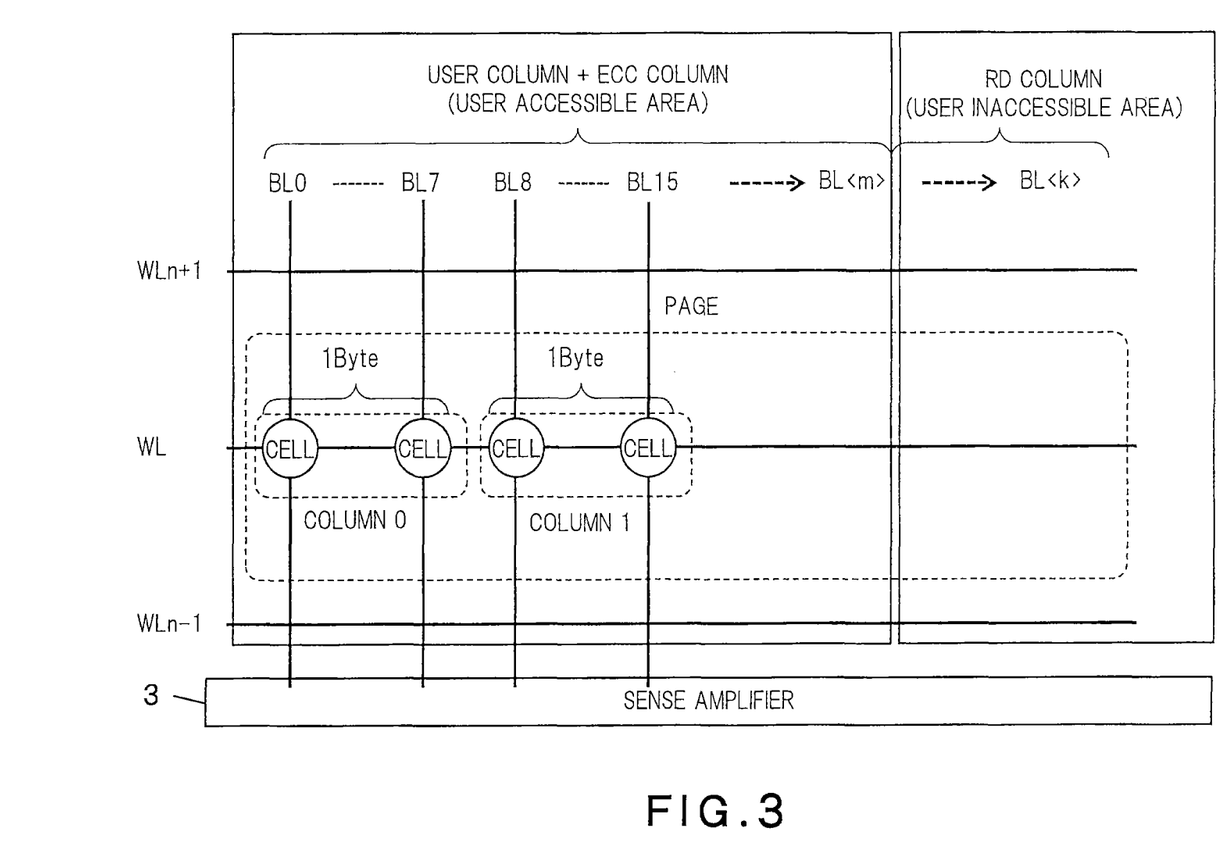
FIG. 3 is a view explaining a column address.

FIG. 3 is a view explaining a column address. The column decoders 5 select one column according to the result of decoding. One column is 1-byte data corresponding to eight bit lines. Different columns are aligned in a word-line (row) direction. Column addresses of, for example, 16 kilobytes are provided so as to be selectable by the column decoders 5, which corresponds to one page. In other words, one page is every column connected to one word line, as shown by broken lines in FIG. 3.

Figure 4:
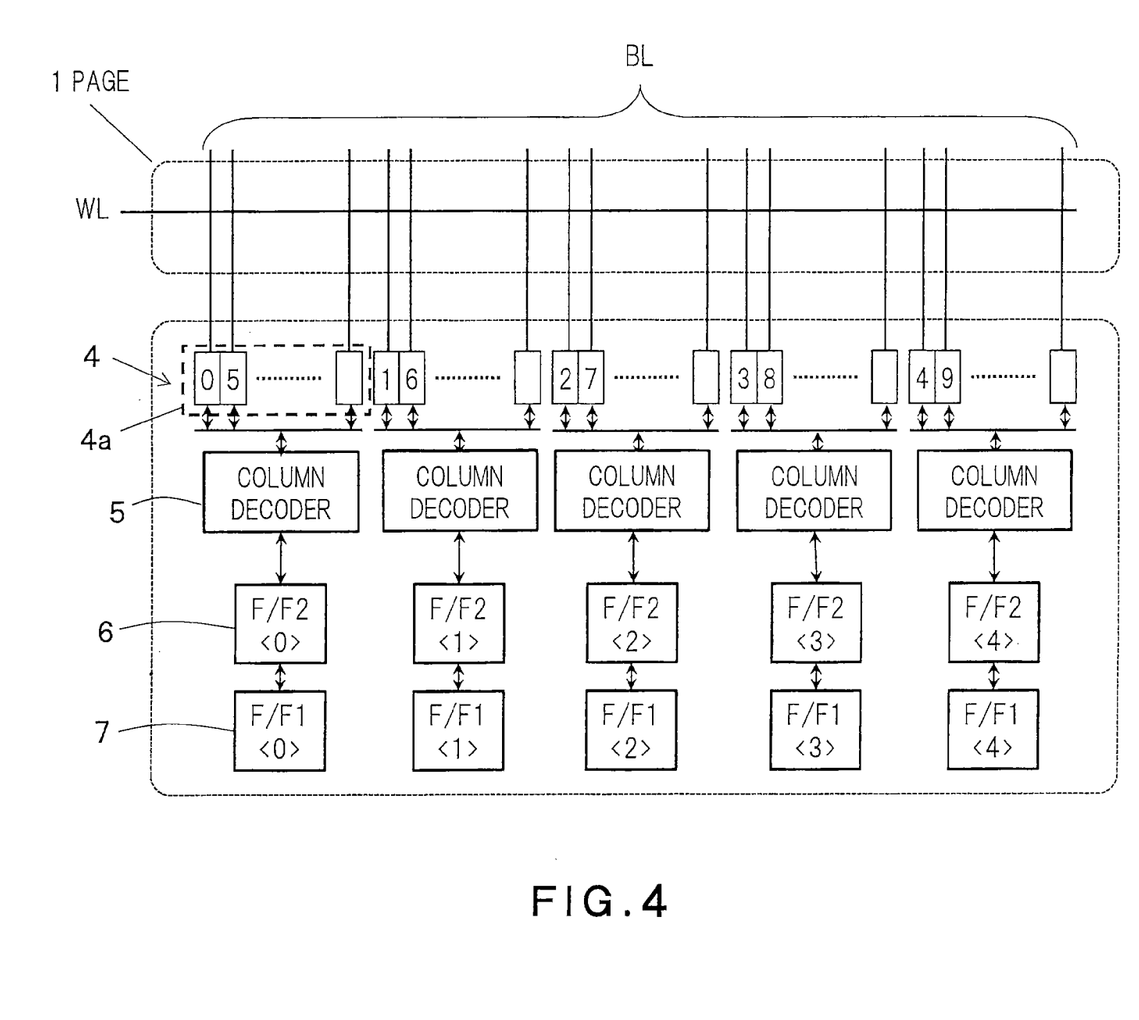
FIG. 4 is a view showing a logical structure of a page buffer 4.

Each page buffer 4 of the present embodiment is logically divided into a plurality of divided page buffer areas. FIG. 4 is a view showing a logical structure of the page buffer 4. As shown, each divided page buffer area 4a corresponds to one of the column decoders 5. Based on the result of decoding by each column decoder 5, access is made to a 1-byte column area in the corresponding divided page buffer area 4a.

Since it takes time for the column decoders 5 to perform a decoding process, in the present embodiment, access is made to the page buffer 4 by interleave access. In the interleave access, access is made to the page buffer 4 after data is ready for each one byte in every page buffer area 4a. Accordingly, the access speed to the page buffer 4 is enhanced while the interval of access to the column decoders 5 is made longer. In this specification, a period of one-time interleave access is referred to as an interleave period.

FIG. 4 shows an example of interleave access to the page buffer 4 logically divided into five areas, which is referred to as 5 interleave.

As shown in FIG. 1, common timing latches (second latches) 6 are connected to the column decoders 5 and an individual timing latch (a first latch) 7 is connected to each common timing latch 6. In other words, a column decoder 5, a common timing latch 6, and an individual timing latch 7 are provided for each of the five divided page buffer areas 4a.

Each individual timing latch 7 latches data at a predetermining timing in each interleave period. For example, in the case of interleaving in five divided page buffer areas 4a, the individual timing latches 7 corresponding to the respective divided page buffer areas 4a latch data at different timings.

The common timing latches 6 latches data per interleave period at a common timing for all of the divided page buffer areas 4a. For example, in the case of data writing, firstly, the individual timing latches 7 latch data at respective shifted timings, and when data latch at all of the individual timing latches 7 is complete, the common timing latches 6 latch the latched data at the same timing. Data latched by each common timing latch 6 is written in a 1-byte column area in the corresponding page buffer area 4a according to the result of decoding by the corresponding column decoder 5.

Figure 5:
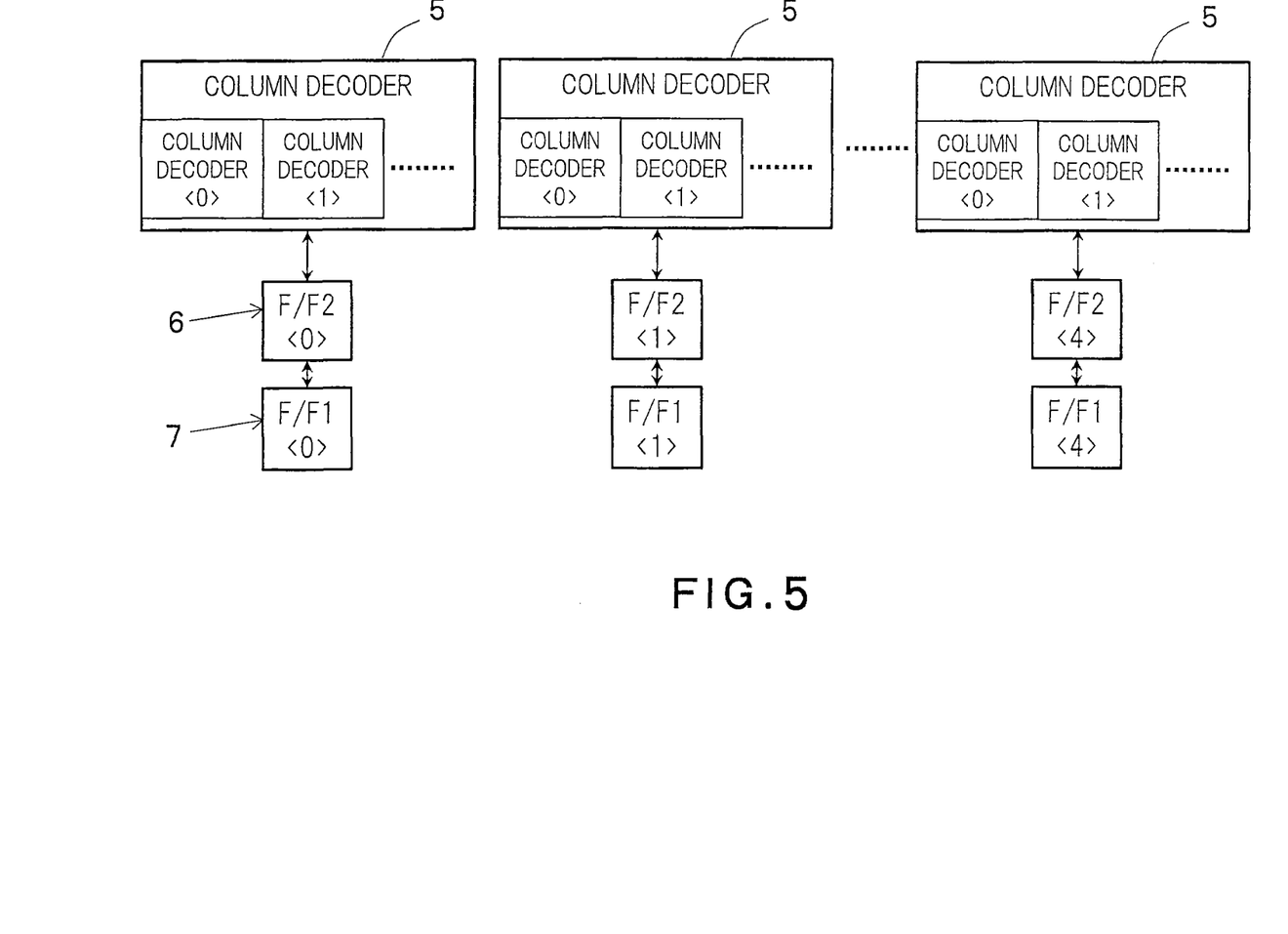
FIG. 5 is a block diagram showing an example of the internal structure of column decoders 5.

FIG. 5 is a block diagram showing the internal structure of the column decoders 5 in more detail. As shown in FIG. 5, each column decoder 5 has a plurality of column decoders <0>~<n-1> that output a result of decoding in accordance with a column address. Outputting a result of decoding means that one of the column decoders <0>~<n-1> is selected in accordance with a column addresses. For example, in the case of data writing, a selected decoder section allows latched data of the corresponding common timing latch 6 to pass therethrough. Latched data that has passed through any one of the column decoders <0>~<n-1> is stored in the page buffer 4. Whenever a column address is input to each column decoder 5, the corresponding column data is passed between the corresponding common timing latch 6 and one of the column decoders <0>~<n-1> selected in accordance with the column address, and between the selected column decoder and the corresponding divided page buffer area 4a in the page buffer 4.

Accordingly, when one column decoder 5 contains an n number of column decoders <0>~<n-1>, the data amount accessible to one column decoder 5 is n bytes. In other words, one column decoder 5 can access n-byte data in the cell array 8. In FIG. 1, broken lines indicate the areas of the cell array 8 and redundant array 9 accessible to each column decoder 5. In this specification, each area surrounded by broken lines in the cell array 8 and each area surrounded by broken lines in the redundant array 9 are referred to as a divided cell array area and a divided redundant array area, respectively.

The semiconductor storage device 1 of FIG. 1 is provided with a controller 11 for interleave access control. The controller 11 generates clocks to be supplied to the individual timing latches 7. The controller 11 may be united with a controller for the entire control of the NAND flash memory or provided separately.

Figure 6:
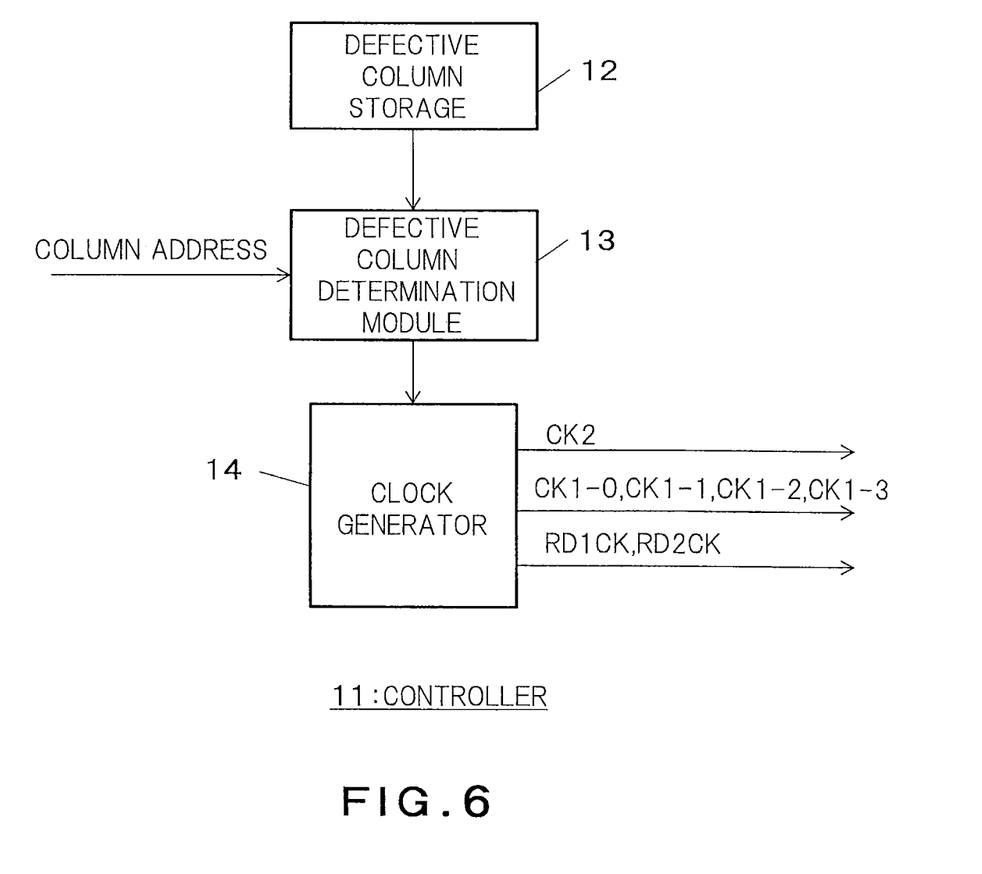
FIG. 6 is a block diagram showing an example of the internal structure of a controller 11.

FIG. 6 is a block diagram showing an example of the internal structure of the controller 11. The controller 11 of FIG. 6 has a defective column storage 12, a defective column determination module 13, and a clock generator 14.

The defective column storage 12 stores the column address of a defective column in the cell of array 8. The defective column determination module 13 determines whether a column address to be accessed matches a column address stored in the defective column storage 12.

The clock generator 14 generates clocks for accessing the respective divided page buffer areas 4a for each interleave access period. Moreover, when the defective column determination module 13 determines that there is a match, instead of a clock for accessing the divided page buffer area 4a that corresponds to a defective column found based on the determination by the defective column determination module 13, at the generation timing of the clock mentioned above, the clock generator 14 generates a clock for accessing the redundant array 9 that has stored the data of the defective column. In more specifically, the clock generator 14 generates clocks for the individual timing latches 7 for each interleave period. Moreover, when the defective column determination module 13 determines that there is a match, instead of a clock for accessing the individual timing latch 7 that corresponds to a defective column found based on the determination by the defective column determination module 13, at the same timing as the clock mentioned above, the clock generator 14 generates a clock for accessing the individual timing latch 7 that corresponds to the redundant array 9 for replacing defective column data.

Figure 7:
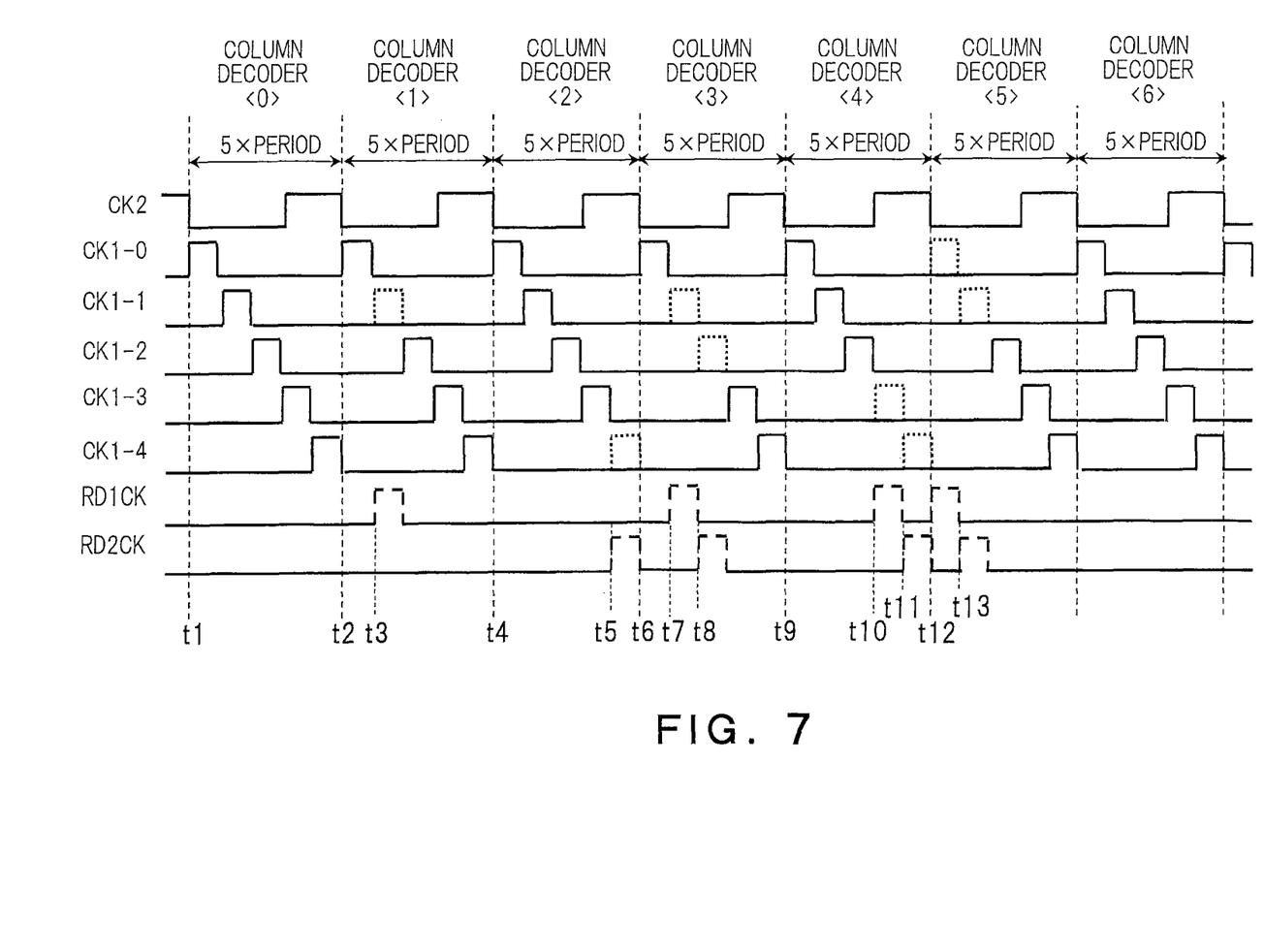
FIG. 7 is a timing chart showing an example of the timing of clocks generated by a clock generator 14.

FIG. 7 is a timing chart showing an example of the timing of clocks generated by the clock generator 14. FIG. 7 shows the case of 5 interleave. In FIG. 7, a column decoder <n-1> represents one column decoder <n-1> selected with a column address among the column decoders <0>~<n-1>, as described in FIG. 5.

Since there is no defective column in the cell array 8, that corresponds to the column decoder <0>, the clock generator 14 sequentially generates clocks shifted at a predetermined interval (time t1 to t2). These clocks are supplied to five individual timing latches 7, respectively. For example, in the case of data writing, in synchronism with these clocks, the five individual timing latches 7 latch write data, and then, the data latched by all of the individual timing latches 7 are latched by the common timing latches 6 at a common timing and each data latched by each common timing latch 6 is written in a 1-byte column area of the corresponding divided page buffer area 4a.

Among the columns in the cell array 8, that correspond to the column decoder <1>, there is a defective column that corresponds to the second individual timing latch 7 from left. Thus, no clocks are generated corresponding to this individual timing latch 7. Instead, a clock is generated for the left-side individual timing latch 7 that corresponds to the redundant array 9 (time t3). The generation timing of this clock is the same timing as the clock which should have been generated for the second individual timing latch 7 from left.

Among the columns in the cell array 8, that correspond to the column decoder <2>, there is a defective column that corresponds to the rightmost individual timing latch 7. Thus, no clocks are generated corresponding to this individual timing latch 7. Instead, a clock is generated for the right-side individual timing latch 7 that corresponds to the redundant array 9 (time t5). The generation timing of this clock is the same timing as the clock which should have been generated for the rightmost individual timing latch 7.

Among the columns in the cell array 8, that correspond to the column decoder <3>, there are defective columns that correspond to the second and third individual timing latches 7 from left, respectively. Thus, no clocks are generated corresponding to these individual timing latches 7. Instead, clocks are generated for two individual timing latches 7 that correspond to the redundant array 9 (time t7 and t8). The generation timings of these clocks are the same timings as the clocks which should have been generated for the second and third individual timing latches 7 from left, respectively.

Among the columns in the cell array 8, that correspond to the column decoder <4>, there are defective columns that correspond to the first and second individual timing latches 7 from right, respectively. Thus, no clocks are generated corresponding to these individual timing latches 7. Instead, clocks are generated for two individual timing latches 7 that correspond to the redundant array 9 (time t10 and t11). The generation timings of these clocks are the same timings as the clocks which should have been generated for the first and second individual timing latches 7 from right, respectively.

Among the columns in the cell array 8, that correspond to the column decoder <5>, there are defective columns that correspond to the first and second individual timing latches 7 from left, respectively. Thus, no clocks are generated corresponding to these individual timing latches 7. Instead, clocks are generated for two individual timing latches 7 that correspond to the redundant array 9 (time t12 and t13). The generation timings of these clocks are the same timings as the clocks which should have been generated for the first and second individual timing latches 7 from left, respectively.

As described above, if there is a defective column in the cell array 8, the clock generator 14 according to the present embodiment generates a clock for data latch by the individual timing latch 7 that corresponds to the redundant array 9 at the same timing as data latch by the individual timing latch 7 that corresponds to the defective column. Therefore, regardless of whether there is a defective column in the cell array 8, there is no change in the number of clocks generated in one interleave period and the clock timing. Accordingly, a 5-interleave operation is constantly maintained and access efficiency to the page buffer 4 is stably improved.

Figure 8:
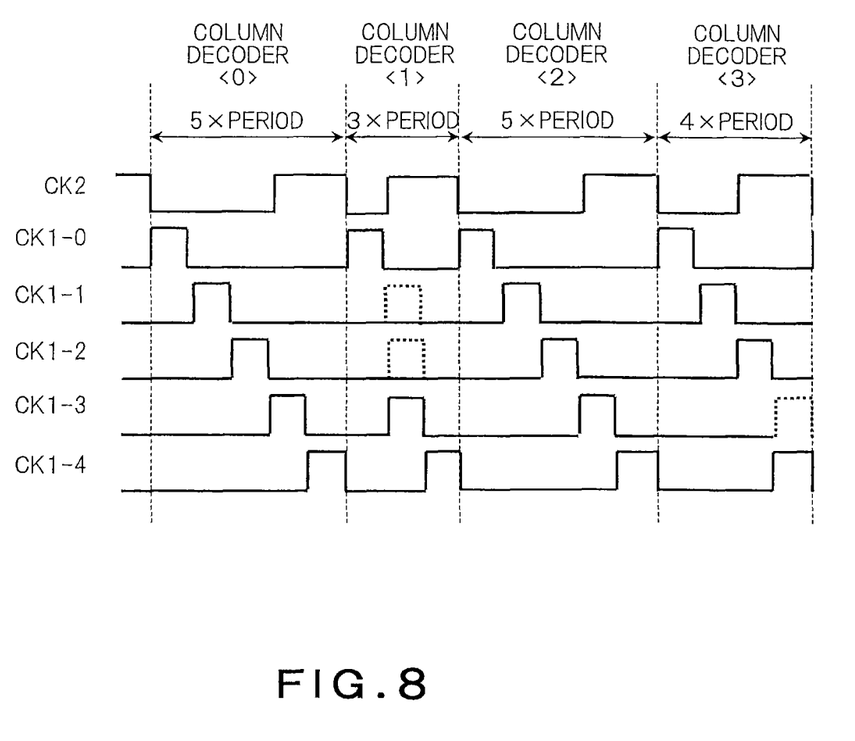
FIG. 8 is a clock timing chart of a comparative example.

As shown in FIGS. 1 and 4, in the present embodiment, five column decoders 5 and five divided page buffer areas 4a are allocated to the cell array 8 whereas two column decoders 5 and two divided page buffer areas 4a are allocated to the redundant array 9. However, these numbers are just an example and can be arbitrary changed. For example, it is supposed that an m number of column decoders 5 and the m number of divided page buffer areas 4a are allocated to the cell array 8 whereas an n (n being an integer equal to or smaller than m) number of column decoders 5 and the n number of divided page buffer areas 4a are allocated to the redundant array 9. In this case, it is possible to replace the maximum n number of defective columns with redundant columns in one interleave period. This is because, in one interleave period, defective columns in the cell array 8 are replaced with redundant columns in different divided redundant array areas in the redundant array 9. FIG. 8 is a clock timing chart of a comparative example.

In this comparative example, redundant columns are provided in a cell array 8 and, instead, a redundant array 9 such as shown in FIG. 1 is omitted. In the comparative example of FIG. 8, when there is a defective column in the cell array 8, no access is made to a divided page buffer area 4a corresponding to the defective column but access is made to a divided page buffer area next to the divided page buffer area 4a to perform defective column replacement.

In the case of FIG. 8, the number of interleaving decreases in an interleave period in which there is a defective column. For example, for a column decoder <1> of FIG. 8, no clocks are generated for the second and third individual timing latches 7 from left and also no other clocks are generated, instead. This results in that only 3 interleave is performed in the interleave period corresponding to the column decoder <1>, leading to the decrease in memory access efficiency. In the similar manner, for a column decoder <3> of FIG. 8, no clocks are generated for the second individual timing latch 7 from right, hence only 4 interleave is performed.

As described above, in the case of the comparative example of FIG. 8, the number of interleaves varies depending on whether there is a defective column, which depends on the interleave period, resulting in variation in data input/output speed to/from the cell array 8.

In the present embodiment shown in FIG. 7, clocks for interleave access are generated at the same timing, irrespective of whether there is a defective column in the cell array 8. Therefore, a predetermined number of interleaves can be performed one by one, and hence data input/output to/from the cell array 8 can be stably performed at higher speed.

In the present embodiment, as shown in FIG. 7, the period of clocks input to the common timing latches 6 is always constant. By contrast, in the comparative example, the period of clocks input to the common timing latches 6 varies depending on whether there is a defective column.

Accordingly, if the location of a defective column in the cell array 8 is identified, by monitoring the clocks of the common timing latches 6 generated for accessing the defective column, it can be determined whether a device has a circuit configuration like the present embodiment or a circuit configuration like the comparative example. In other words, by providing signal terminals for monitoring the clocks mentioned above, it can be tested whether the circuit of the present embodiment is correctly operating.

Although, the explanation has been made for a NAND flash memory in the embodiment described above, the present embodiment is applicable to a variety of types of semiconductor storage devices 1 in addition to the NAND flash memory, as long as the cell array 8 and the redundant array 9 can be arranged in the row direction.

As described above, in the present embodiment, when there is a defective column in the cell array 8, a clock is generated for the individual timing latch 7 for latching, that corresponds to a column for replacement in the redundant array 9, at the timing of latching by the individual timing latch 7 that corresponds to the defective column. The number of clocks generated in each interleave period is thus always constant. Therefore, irrespective of whether there is a defective column in the cell array 8, the number of interleaves is constant, and hence memory access is made stably at higher speed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a cell array;
a redundant array provided logically separated from the cell array, the redundant array comprising a column area replaceable with a defective column in the cell array;
a cache memory comprising a storing area of data read from or written in the cell array by one access, the cache memory allowing interleave access to a plurality of divided areas to which the area is logically divided;
a defective column storage to store a column address of a defective column in the cell array;
a defective column determination module to determine whether a column address to be accessed matches the column address stored in the defective column storage; and a clock generator to generate a clock for accessing each of the divided areas for each period of the interleave access and, when the defective column determination module determines that there is a match, instead of a clock accessing a divided page buffer area that corresponds to the defective column, at the generation timing of the clock accessing the divided page buffer area, to generate a clock accessing the redundant array that has stored data of the defective column.

2. The device of claim 1 further comprising:
a plurality of first latches to latch data at shifted timings with the clocks generated by the clock generator; and
a plurality of second latches to latch the data latched by the first latches or data which should be latched by the first latches at a common timing,
wherein, in data writing to the cell array, the data latched by the second latches are stored in column areas of the divided areas so that data latched by each second latch is stored in one column area of each divided area, and
in data reading from the cell array, the data stored in the column areas of the divided areas are latched by the second latches at a common timing.

3. The device of claim 2, wherein
the cache memory has two or more divided redundant areas storing data in place of data of two or more defective columns in the cell array, and
when the defective column determination module determines that a column address to be accessed matches the column address stored in the defective column storage, instead of generating a clock accessing a divided area corresponding to a column address of the defective column, the clock generator generates a clock accessing any one of the two or more divided redundant areas at a generation timing of the clock accessing the divided area corresponding to the column address of the defective column.

4. The device of claim 1, wherein the clock generator generates a same number of clocks for each period of the interleave access irrespective of whether there is a defective column in the cell array.

5. The device of claim 1, wherein the clock generator generates a plurality of clocks at a predetermined timing for each period of the interleave access irrespective of whether there is a defective column in the cell array.

6. The device of claim 5 further comprising signal terminals monitoring clocks of the second latches.

7. The device of claim 1, wherein the cell array and the redundant array provided logically separated from each other are arranged in a row direction, and row decoders are arranged on both sides of arranged cell and redundant arrays.

8. The device of claim 1, wherein
the cell array comprises a user column area storing data in each column so as to be associated with a column address specified by a user and an ECC column area storing error correction data in each column,
the redundant array comprises a redundant column area with which data of a defective column in the user column area is replaceable.

9. The device of claim 1, wherein
the cell array and the redundant array are logically divided into an m number of divided all areas and an n (n being an integer equal to or smaller than m) number of divided redundant array areas, respectively, as associated with the divided areas, and
a maximum n number of defective columns are replaced with redundant columns in respective redundant array areas within one interleave period.

10. The device of claim 1, wherein the cell array is a NAND flash memory cell array.

11. The device of claim 1, wherein
the cell array is divided into a plurality of blocks aligned in a column direction, each block being a unit of erase, and
the cache memory is accessed per bit line that connects the blocks in the column direction.

* * * * *